(12) United States Patent
Chia et al.

(10) Patent No.: US 10,763,086 B2
(45) Date of Patent: Sep. 1, 2020

(54) HIGH CONDUCTANCE PROCESS KIT

(71) Applicant: Applied Materials, Inc., Santa Clara, CA (US)

(72) Inventors: Bonnie T. Chia, Sunnyvale, CA (US); Cheng-hsiung Tsai, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 452 days.

(21) Appl. No.: 15/864,074

(22) Filed: Jan. 8, 2018

(65) Prior Publication Data

US 2018/0130644 A1    May 10, 2018

Related U.S. Application Data

(62) Division of application No. 14/586,153, filed on Dec. 30, 2014, now Pat. No. 9,865,437.

(51) Int. Cl.
| | |
|---|---|
| *C23C 16/00* | (2006.01) |
| *H01J 37/32* | (2006.01) |
| *C23C 16/455* | (2006.01) |

(52) U.S. Cl.
CPC .. *H01J 37/32651* (2013.01); *C23C 16/45563* (2013.01); *C23C 16/45565* (2013.01); *H01J 37/3244* (2013.01); *H01J 37/32477* (2013.01)

(58) Field of Classification Search
CPC ........... H01J 37/32651; H01J 37/32504; H01J 37/32458; H01J 37/16
See application file for complete search history.

(56) References Cited

U.S. PATENT DOCUMENTS

| | | | |
|---|---|---|---|
| 2002/0101167 A1 | 8/2002 | Shan et al. | |
| 2004/0206309 A1* | 10/2004 | Bera | H01J 37/321 |
| | | | 118/728 |

(Continued)

FOREIGN PATENT DOCUMENTS

| | | |
|---|---|---|
| CN | 101523592 A | 9/2009 |
| CN | 101583736 A | 11/2009 |

(Continued)

OTHER PUBLICATIONS

International Search Report and Written Opinion of the International Searching Authority for PCT/US2015/060075 dated Feb. 22, 2016 (9 pages).

(Continued)

*Primary Examiner* — Keath T Chen
(74) *Attorney, Agent, or Firm* — Patterson + Sheridan LLP

(57) ABSTRACT

Apparatus for plasma processing of semiconductor substrates. Aspects of the apparatus include an upper shield with a gas diffuser arranged at a center of the upper shield. The gas diffuser and upper shield admit a process gas to a processing chamber in a laminar manner. A profile of the upper shield promotes radial expansion of the process gas and radial travel of materials etched from a surface of the substrates. Curvatures of the upper shield direct the etched materials to a lower shield with reduced depositing of etched materials on the upper shield. The lower shield also includes curved surfaces that direct the etched materials toward slots that enable the etched materials to exit from the process chamber with reduced depositing on the lower shield.

8 Claims, 8 Drawing Sheets

(56) References Cited

U.S. PATENT DOCUMENTS

| | | |
|---|---|---|
| 2006/0130756 A1 | 6/2006 | Liang et al. |
| 2006/0196603 A1 | 9/2006 | Lei et al. |
| 2006/0196604 A1 | 9/2006 | Moriya et al. |
| 2006/0219361 A1 | 10/2006 | Wang et al. |
| 2007/0116888 A1* | 5/2007 | Faguet ............. C23C 16/45525 427/569 |
| 2007/0266945 A1* | 11/2007 | Shuto ................. C23C 16/4585 118/723 E |
| 2007/0269983 A1 | 11/2007 | Sneh |
| 2008/0264340 A1* | 10/2008 | Martinson ............ C23C 14/564 118/715 |
| 2009/0188625 A1* | 7/2009 | Carducci ........... H01J 37/32467 156/345.34 |
| 2009/0250334 A1 | 10/2009 | Qiu et al. |
| 2011/0098841 A1 | 4/2011 | Tsuda |

FOREIGN PATENT DOCUMENTS

| | | |
|---|---|---|
| CN | 102905405 A | 1/2013 |
| CN | 103068137 A | 4/2013 |
| JP | H04-033330 A | 2/1992 |
| JP | H06-13344 A | 1/1994 |
| JP | H09-69400 A | 3/1997 |
| JP | H09-283499 A | 10/1997 |
| JP | 2010232315 A | 10/2010 |
| JP | 2012-182496 A | 9/2012 |
| JP | 2013-243172 A | 12/2013 |
| JP | 2013243175 A | 12/2013 |
| TW | 201123291 A | 7/2011 |
| TW | 201134314 A | 10/2011 |

OTHER PUBLICATIONS

China Office Action dated Sep. 3, 2018 for Application No. 201580071068.1.

Taiwan Office Action for Application No. 104140794 dated Mar. 28, 2019.

Japan Office Action for Application No. 2017-534999 dated Nov. 26, 2019 (with English Translation), 10 pages.

* cited by examiner

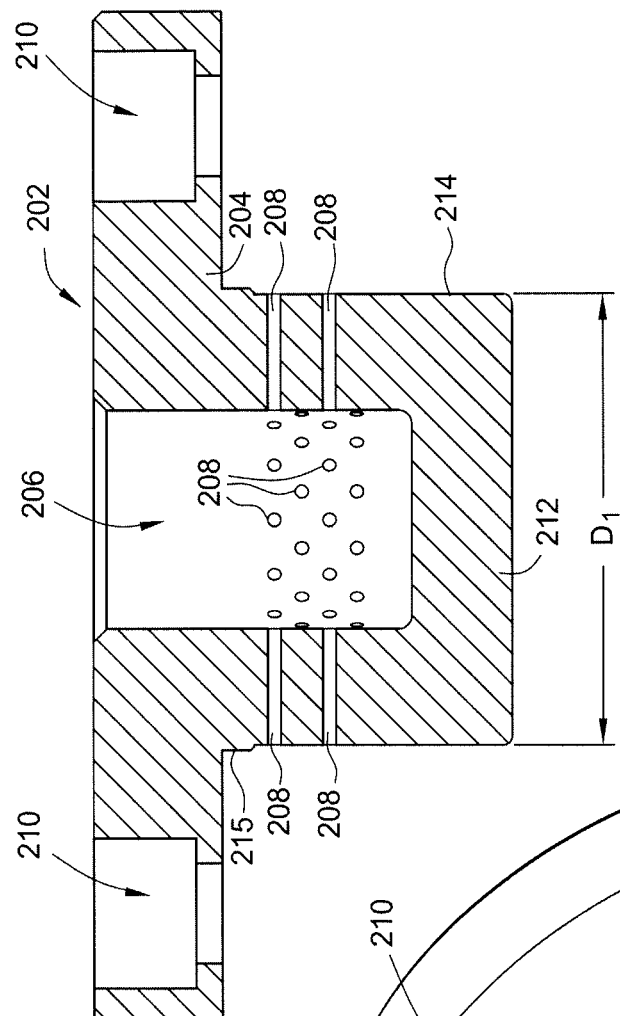
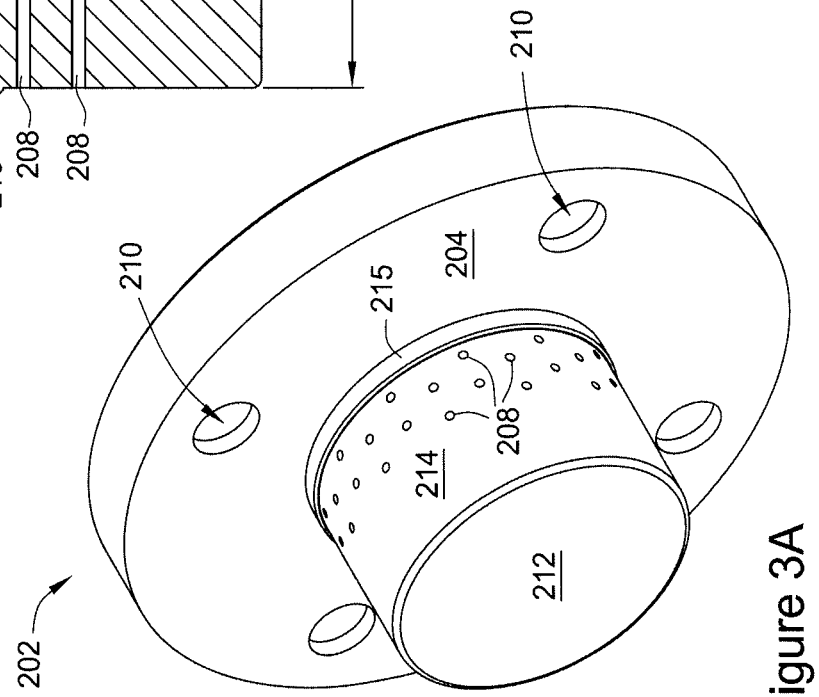
Figure 3B
Figure 3A

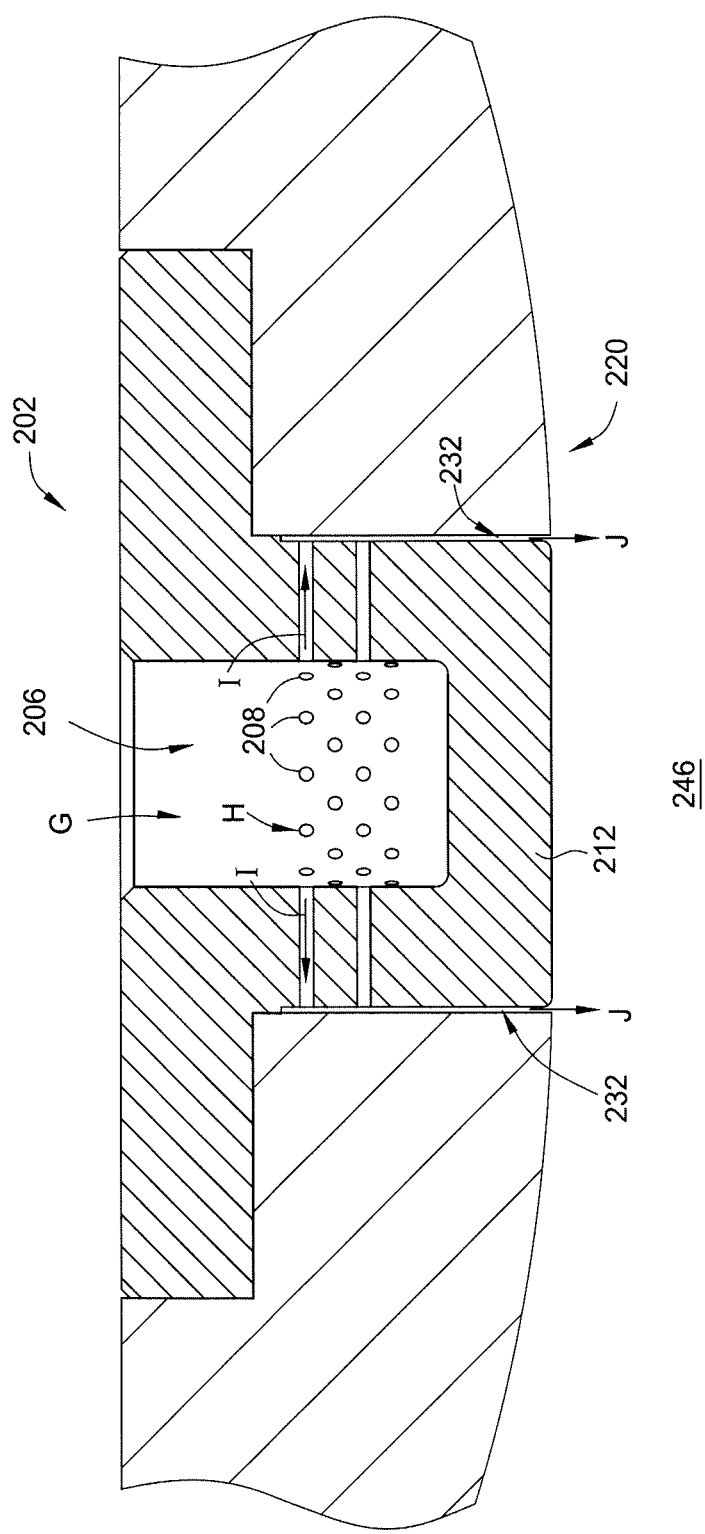

HIGH CONDUCTANCE PROCESS KIT

CROSS-REFERENCE TO RELATED APPLICATIONS

This application is a divisional of co-pending U.S. patent application Ser. No. 14/586,153, filed Dec. 30, 2014, which is herein incorporated by reference.

BACKGROUND

Field

Embodiments of the present invention generally relate to plasma cleaning or etching in the process of fabricating integrated circuits. In particular, the invention relates to a process kit for a plasma chamber.

Description of the Related Art

Plasma chambers are used in integrated circuit manufacturing to remove contaminants from the surface of a substrate and/or to etch surfaces of a substrate. To perform a plasma cleaning or etching process, an integrated circuit is placed in a plasma chamber and a pump removes most of the air from the chamber. A gas, such as argon, can then be injected into the chamber. Electromagnetic energy (e.g., radio frequency) is applied to the injected gas to excite the gas into a plasma state. The plasma releases ions that bombard the surface of the substrate to remove contaminants and/or material from the substrate. Atoms or molecules of the contaminants and/or substrate material are etched from the substrate and are, for the most part, pumped out of the chamber. However, some of the contaminant and/or etched material may be deposited on surfaces of the chamber.

Some plasma process chambers are designed with liners having walls that form a tortuous flow path for gasses passing through the chamber. The parts of the plasma process chamber that form the liners are referred to as a process kit. The walls of the liners trap the plasma in the chamber while providing a path for the displaced contaminants and/or substrate materials to escape. Inevitably, some of the displaced materials are deposited on the walls of the chamber, especially at corner locations where the displaced materials change direction. Eventually, the parts making up the process kit need to be cleaned or replaced due to the buildup of displaced materials. Otherwise, the buildup of displaced materials could become a particle source that could affect chip yield.

FIG. 1 is a cross-sectional schematic side view of one embodiment of a conventional plasma processing chamber 100 in which a process kit may be used. The plasma processing chamber 100 includes chamber walls 104 and a lid 102 that define a volume. The lid includes a port 106 through which a process gas, such as argon, can be introduced. The wall 104 includes a port 108 through which contaminants and/or substrate materials removed from a substrate 126 and any plasma that escapes the process region 132 can be removed. For example, the port 108 could be in communication with a pump (e.g., a turbo pump) that pulls such materials out of the volume. The plasma processing chamber 100 includes a pedestal 124 on which a substrate 126 can be mounted for processing. The pedestal 124 and the substrate 126 can be in electrical communication with a radio frequency source 128 (e.g., a dual frequency radio frequency source). The electromagnetic energy transmitted by the radiofrequency source 128 through the pedestal 124 excites the process gas into a plasma 130 above the substrate 126. The plasma processing chamber 100 also includes a process kit that defines boundaries of the process region 132. The process kit includes an upper shield 110 and a lower shield 116.

The upper shield 110 includes a top portion 115 and a cylindrical liner 114. The lower shield 116 includes a horizontal portion 118 extending from the pedestal 124 and a vertical portion 120 extending from the horizontal portion 118. Generally, the lower shield 116 is electrically isolated from the pedestal 124 by an insulating material. The upper shield 110 and the lower shield 116 include and/or define apertures that provide a fluid flow path from the port 106 in the lid to the port 108 in the wall 104. The top portion 115 of the upper shield 110 includes a plurality of apertures 112 arranged around the circumference of the top surface 115 that allow process gas into the process region 132. The cylindrical liner 114 of the upper shield 110 and the vertical portion 120 of the lower shield 116 define an annular aperture or apertures 122 there between that enable materials removed from the substrate 126 to escape. Arrows A-F illustrate the flow of process gas into the plasma process chamber and the flow of contaminants and/or substrate material out of the plasma processing chamber 100. Arrow A illustrates the process gas entering through the port 106 in the lid 102. The process gas may be provided by a supply line, a pressurized canister, or the like that is connected to the port 106. As illustrated by arrow B, after entering through the port 106, the process gas travels radially outward toward the apertures 112 in the upper shield 110. The process gas then passes through the apertures 112 in the direction of arrow C to enter the process region 132. In the process chamber, the process gas is ignited to form a plasma by the electromagnetic energy from the radiofrequency source 128. The electromagnetic energy also generally contains the plasma 130 in a region above the substrate 126. The ions from the plasma bombard the surface of the substrate 126, causing contaminants and/or substrate material to be released from the surface of the substrate 126. The released contaminants and/or substrate material exits the process region 132 through the annular aperture 122 between the cylindrical liner 114 of the upper shield 110 and the vertical portion 120 of the lower shield 116, as indicated by arrow D. The released contaminants and/or substrate material can then move past the lower shield in the direction of arrow E and can then exit the plasma processing chamber 100 through the port 108 in the wall 104, as indicated by arrow F. As discussed above, a pump, such as a turbo pump, can provide a vacuum that urges the contaminants and/or substrate material to exit the plasma processing chamber 100.

SUMMARY

In various instances, a process kit for a plasma processing chamber includes an upper shield. The upper shield includes an interior cylindrical liner defining a cylindrical volume, wherein a bottom of the cylindrical liner defines a plane. The upper shield also includes a circular interior top surface. A center of the circular interior top surface includes a circular aperture. The circular interior top surface also includes a first portion extending radially outward from the aperture in which a distance from the interior top surface to the plane increases as the distance from the aperture increases. The circular interior top surface also includes a second portion extending radially outward from the first portion in which the interior top surface smoothly curves toward and mates with an inward-facing surface of the cylindrical liner.

In various instances, a process kit for a plasma processing chamber includes a gas diffuser configured to be arranged within a circular aperture on an upper shield for a plasma processing chamber. The gas diffuser includes a cylindrical housing that defines a cylindrical exterior surface. The cylindrical exterior surface defines a diameter that is smaller than a diameter of the circular aperture of the upper shield to form an annular gap when the gas diffuser is arranged within the circular aperture.

The gas diffuser also includes an interior cylindrical cavity in a side of the housing facing away from the cylindrical volume, wherein the interior cylindrical cavity is adapted for fluid communication with a process gas supply. The gas diffuser also includes a plurality of holes in the housing in communication with the interior cylindrical cavity and the annular gap.

In various instances, a process kit for a plasma processing chamber includes a lower shield. The lower shield includes an annular ring and an annular channel in a top surface of the annular ring. A radially-outward-facing liner and a bottom liner of the annular ring include a circularly-curved liner portion there between. The annular channel also includes a radially-outward-projecting undercut portion. The lower shield also includes a first plurality of slots between the undercut portion and the top surface of the annular ring, wherein the first plurality of slots are arranged around a circumference of the annular ring. The lower shield also includes a second plurality of slots between the undercut portion and a bottom surface of the annular ring, wherein the second plurality of slots are arranged around a circumference of the annular ring.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 3A is a bottom perspective view of the diffuser shown in FIG. 2A;

FIG. 3B is a cross-sectional side view of the diffuser of FIG. 2A;

FIG. 4 is a cross-sectional side view of the diffuser of FIG. 2A installed in an upper shield shown in FIG. 2A;

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Aspects of a process kit described herein can provide more efficient plasma processing while reducing the buildup of contaminants on surfaces of the process kit. Contaminants on surfaces of the process kit could become particle sources that could contaminate substrates in the chamber and affect chip yield.

Figure 1:
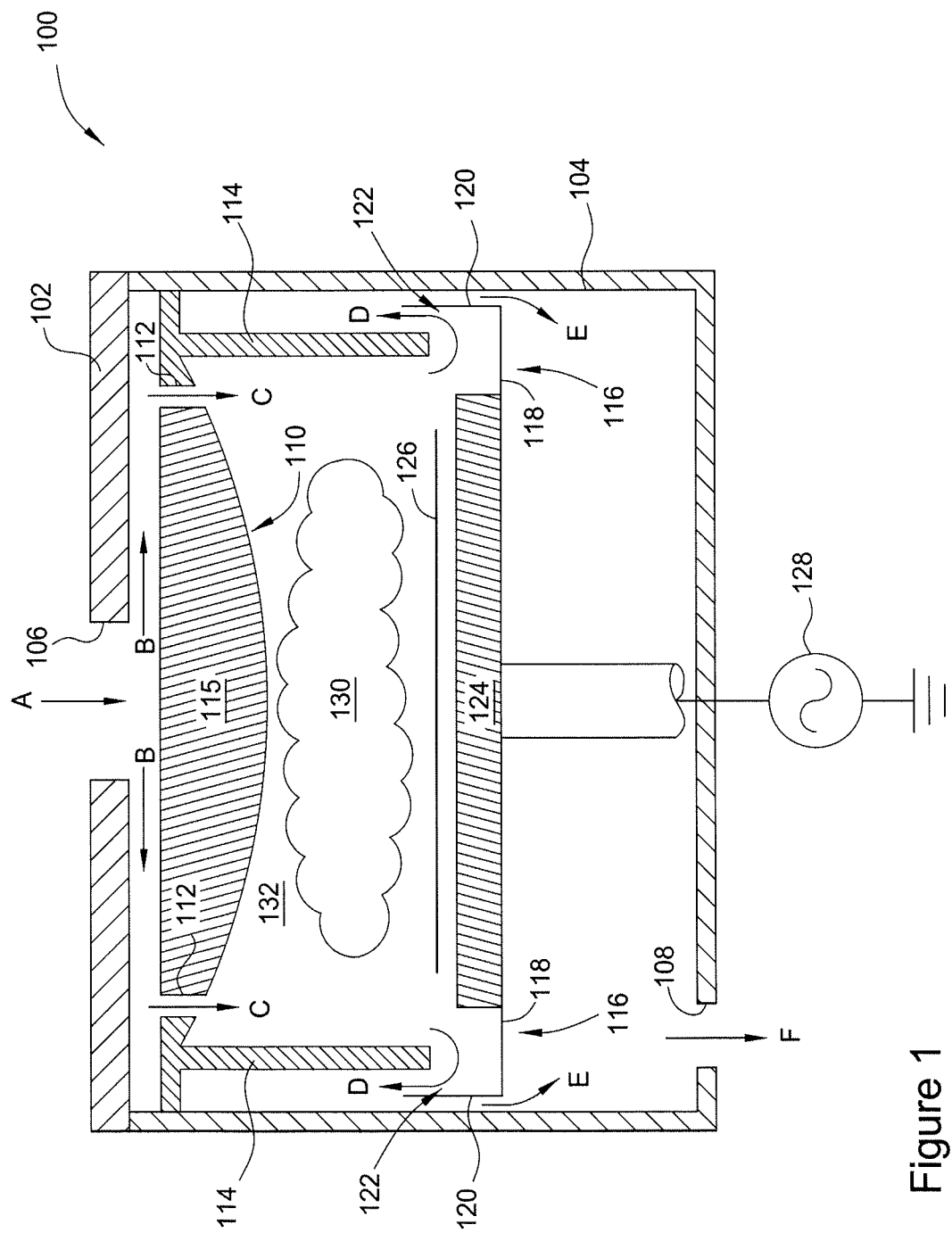
FIG. 1 is a cross-sectional block diagram of a conventional plasma process chamber.
Figure 2A:
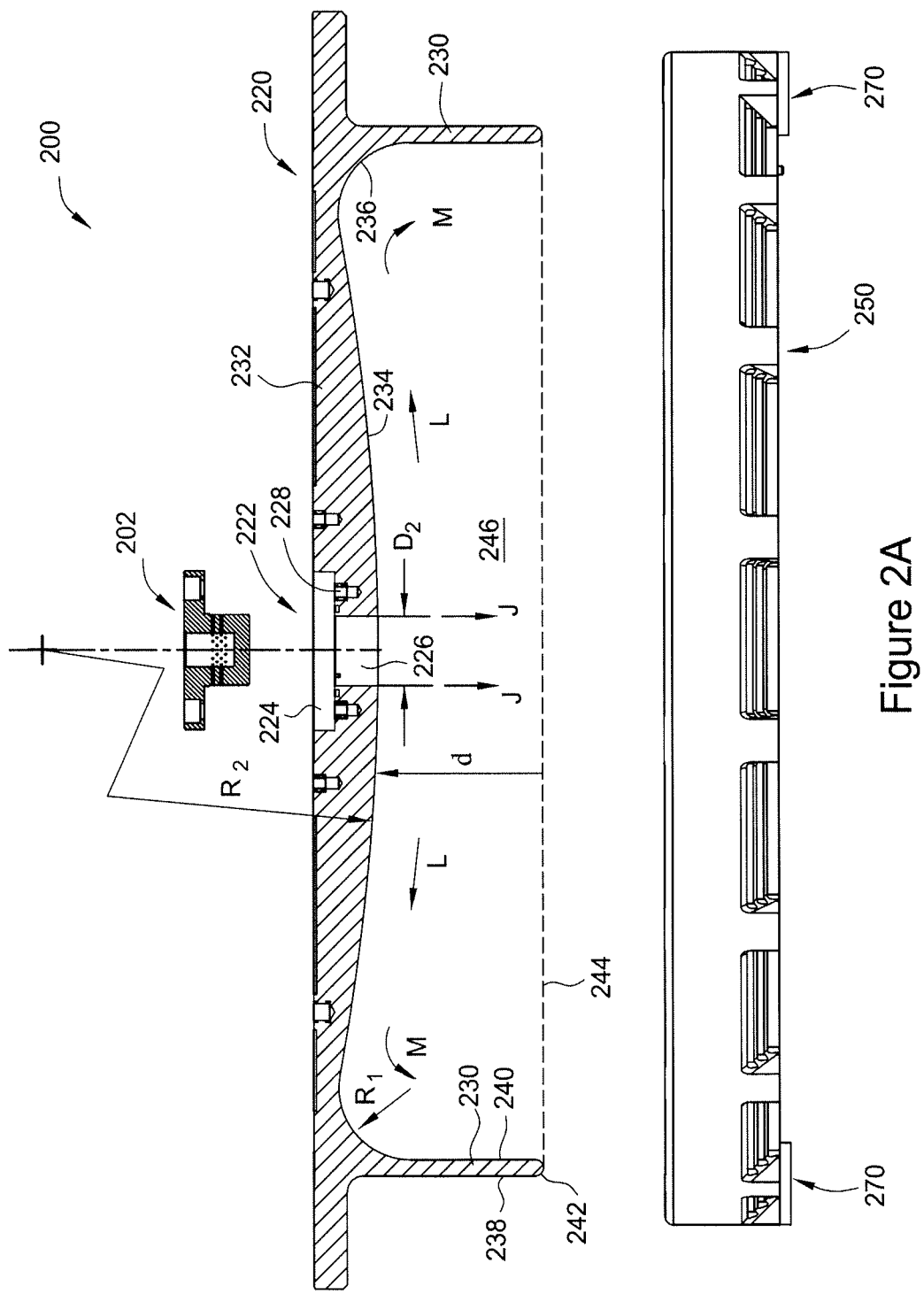
FIG. 2A is a cross-sectional side view of a process kit according to various aspects that includes an upper shield, a diffuser, and a lower shield.
Figure 2B:
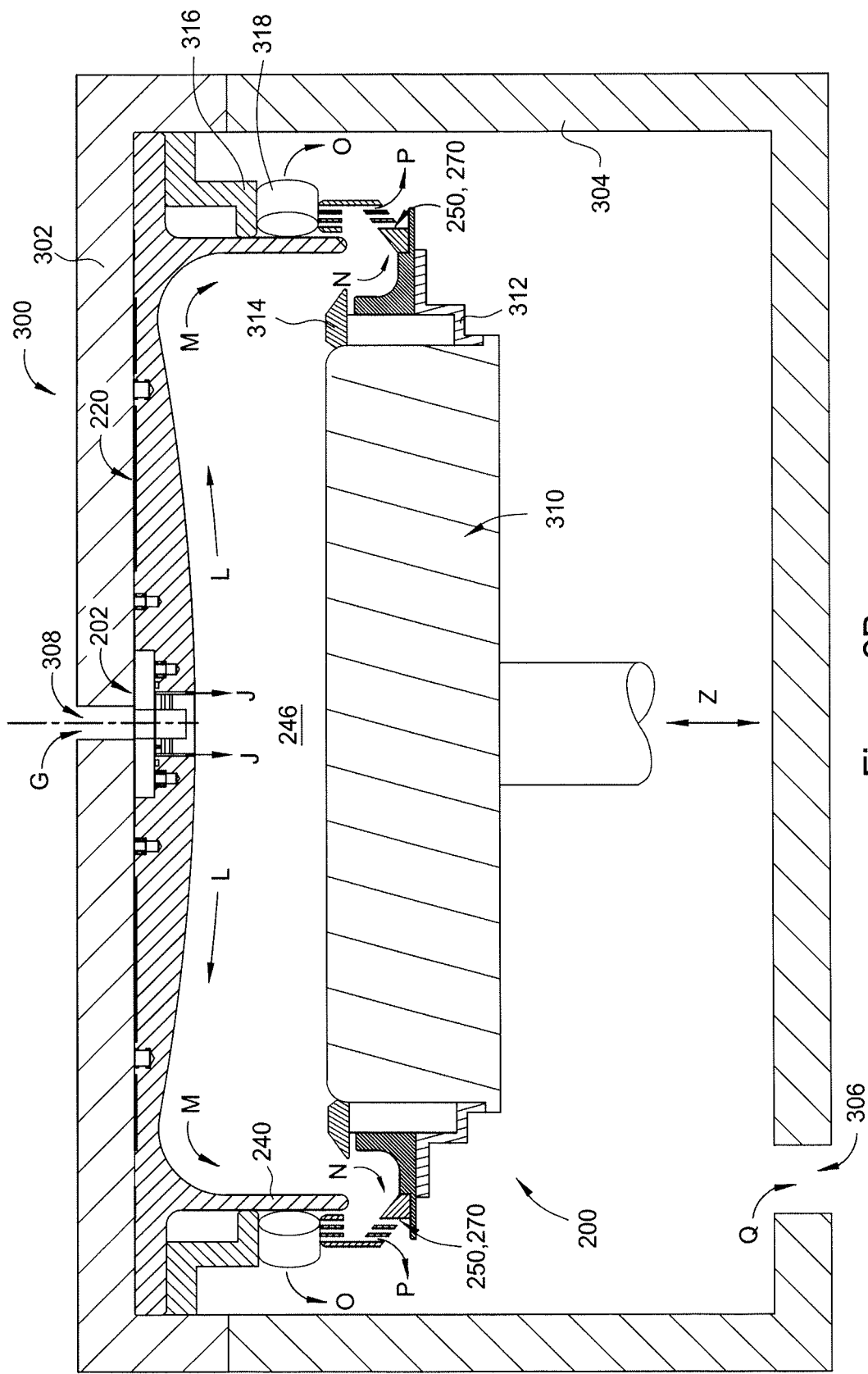
FIG. 2B is a cross-sectional view of the process kit of FIG. 2A installed in a plasma process chamber.

FIG. 2A is an exploded side view of a process kit 200 according to various aspects for use in a plasma processing chamber. FIG. 2B shows the process kit 200 arranged in a plasma processing chamber 300. The process kit 200 includes at least one or more of a diffuser 202, an upper shield 220, and a lower shield 250, 270. The diffuser 202 sits within an aperture 222 in the upper shield 220 such that process gas is injected through the diffuser 202 and the upper shield 220 in the middle or center of the upper shield 220 rather than along the perimeter of the upper shield 110 shown in FIG. 1. The upper shield 220 and the lower shield 250, 270 include rounded corners that help to smoothly direct contaminants and/or substrate material removed by plasma out of the process region 246 and, as a result, to minimize buildup of such contaminants and/or substrate material on surfaces of the upper shield 220 and the lower shield 250, 270.

The upper shield 220 includes a top 232 and a cylindrical liner 230. Interior surfaces 234 and 236 of the top 232 and interior surfaces 240 of the cylindrical liner 230 define boundaries of a process region 246. A bottom 242 of the cylindrical liner 230 defines a plane 244 (indicated by a dashed line). The top 232 includes an aperture 222 located at the center of the top 232. An inward portion of the interior surface 234 of the top 232 extends radially away from the aperture 222 and diverges from the plane 244 at greater radial distances. Put differently, a distance (indicated by arrow d) from the plane 244 to the inward portion of the interior surface 234 is larger at larger radial distances from the aperture 222. In various instances, the inward portion of the interior surface 234 could include a conical profile, wherein the distance from the plane 244 to the inward portion of the interior surface 234 increases linearly with respect to the radial distance from the aperture 222. In various other instances, the inward portion of the interior surface 234 could include a curved profile, wherein the distance from the plane 244 to the inward portion of the interior surface 234 increases nonlinearly with respect to the radial distance from the aperture 222. For example, as illustrated in FIG. 2, the inward portion of the interior surface 234 could have a circular profile. For example, in various aspects, the cylindrical liner 230 of the upper shield 220 has a diameter of approximately 16 inches and the circularly-curved inward portion of the interior surface 234 has a radius of curvature $R_2$ of approximately 35 inches. As another example, the radius of curvature $R_2$ of the circularly curved interior surface 234 could be between 30 inches and 40 inches. An outward portion of the interior surface 236 of the top 232 extends radially away from interior surface 234 and curves inwardly to meet the interior surface 240 of the cylindrical liner 230. The outward portion of the interior surface 236 can define a radius of curvature $R_1$ of 1.1 inches in some instances. In various other instances, the outward portion of the interior surface 236 can define a radius of curvature $R_1$ of between 0.9 inches and 2 inches, for example.

Referring now to FIGS. 3A and 3B, the diffuser 202 can be configured to fit within the aperture 222 of the upper shield 220. The diffuser 202 includes a body 204 and a gas injection housing 212. The body 204 can include threaded holes 210 that can align with holes 228 in the upper shield 220. Cap screws or other fasteners can be placed through the threaded holes 210 and into the holes 228 in the upper shield to secure the diffuser 202 to the upper shield 220. The gas injection housing 212 can include a first outer cylindrical wall 215 and a second outer cylindrical wall 214. The second outer cylindrical wall 214 can be arranged closer to the interior surface 234 of the upper shield 220. The first outer cylindrical wall 215 can define a larger diameter than a diameter $D_1$ of the second outer cylindrical wall 214. For example, in various instances, the first outer cylindrical wall 215 defines a diameter of 1.060 inches and the second outer cylindrical wall 214 defines a diameter $D_1$ of 1.030 inches. The diffuser 202 and gas injection housing 212 define an interior cylindrical cavity 206 that can be in communication with a process gas supply for a plasma processing chamber. An array of gas injection apertures 208 can be arranged in the gas injection housing 212 from the interior cylindrical cavity 206 to the second outer cylindrical wall 214. As shown in FIGS. 3A and 3B, the gas injection apertures 208 can be arranged around a circumference of the interior cylindrical cavity 206 and/or at different longitudinal locations along the interior cylindrical cavity 206. In the exemplary diffuser 202 shown in FIGS. 3A and 3B, there are four longitudinal rows of gas injection apertures 208, and each row of gas injection apertures 208 includes twelve gas injection apertures 208 arranged around a circumference of the interior cylindrical cavity 206. In various instances, each of the gas injection apertures 208 has a diameter of 0.030 inches. In various other instances, each of the gas injection apertures 208 includes a diameter between 0.020 inches and 0.040 inches. In various other instances, each of the gas injection apertures 208 could have a diameter of between 0.010 inches and 0.050 inches.

FIG. 4 illustrates the diffuser 202 installed in the upper shield 220. Referring also to FIG. 2, the upper shield 220 includes an aperture 222 that includes a first portion 224 that defines a first diameter and a second portion 226 that defines a second diameter $D_2$. When the diffuser 202 is installed in the upper shield 220, the body 204 of the diffuser 202 sits within the first portion 224 of the aperture 222 and the gas injection housing 212 sits within the second portion 226 of the aperture 222. The diameter $D_2$ of the second portion 226 of the aperture 222 is equal to or greater than the diameter of the first outer cylindrical wall 215 of the diffuser 202. For example, as described above, the diameter of the first outer cylindrical wall 215 of the diffuser 202 could be 1.060 inches in some instances. The diameter $D_2$ of the second portion 226 of the aperture 222 could be between 1.060 inches and 1.065 inches, for example. As a result, in some instances, the diffuser 202 can snugly fit within the aperture 222 of the upper shield 220.

As discussed above, the diameter $D_1$ of the second outer cylindrical wall 214 of the diffuser 202 is smaller than the diameter of the first outer cylindrical wall 215. As a result, the diameter $D_1$ of the second outer cylindrical wall 214 is also smaller than the diameter $D_2$ of the second portion 226 of the aperture 222. The smaller diameter $D_1$ of the second outer cylindrical wall 214 relative to the diameter $D_2$ of the second portion 226 of the aperture 222 results in an annular gap 232 between the upper shield 220 and the diffuser 202. For example, as described above, the diameter $D_1$ of the second outer cylindrical wall 214 could be 1.030 inches. If the diameter $D_2$ of the second portion 226 of the aperture 222 in the upper shield 220 is 1.060 inches, then the resulting annular gap 232 would have a width of 0.015 inches. The annular gap 232 is in communication with the process region 246 defined by the upper shield 220. In various instances, a length of the second outer cylindrical wall 214 is approximately 0.60 inches. As a result, an aspect ratio of the annular gap 232 (defined as the length of the annular gap 232 divided by the width of the annular gap 232) would be 0.60 inches divided by 0.015 inches, or 30 to 1. In various instances, the aspect ratio of the annular gap 232 can be between 20 to 1 and 40 to 1. The annular gap 232 is also in communication with the interior cylindrical cavity 206 in the diffuser 202 via the gas injection apertures 208. In various instances, the gas injection apertures 208 can be arranged in the interior cylindrical cavity 206 such that they exit through the second outer cylindrical wall 214 in the first third of a length of the second outer cylindrical wall 214 closest to the first outer cylindrical wall 215. In such an arrangement, process gas flows into the interior cylindrical cavity 206 of the diffuser 202 in the direction of arrow G. The process gas then flows through the gas injection apertures 208 (as indicated by arrows H) and into the annular gap 232 (as indicated by arrows I). The process gas then moves along the annular gap 232 to enter the process region 246 defined by the upper shield 220 (as indicated by arrows J). The process gas enters the process region 246 in the shape of an annular ring. In various instances, the process gas can enter the process region 246 in a laminar flow arrangement. In the exemplary instance described above in which there are 48 gas injection apertures 208 each with the diameter of 0.030 inches, the total area of the gas injection apertures 208 would be 0.017 in.$^2$. Furthermore, for an annular gap 232 having an inner diameter D1 of 1.030 inches and a gap of 0.015 inches, the total area for the annular gap 232 would be approximately 0.10 inches. Thus, a ratio of the total area for the annular gap 232 to the total area of the gas injection apertures 208 is almost 6 to 1. In various instances the ratio of the total area for the annular gap 232 to the total area of the gas injection apertures 208 can be between 4 to 1 and 15 to 1. A combination of the large aspect ratio (e.g., 30 to 1) and ratio of total areas (e.g., 6 to 1) can result in a significant pressure drop of the process gas as it flows from the interior cylindrical cavity 206 into the process region 246. This large pressure drop can ensure that the process gas enters the process region 246 in a laminar flow.

Referring again to FIGS. 1 and 2, when the process gas enters the process region 246 in the direction of arrow J, electromagnetic energy ignites the process gas (e.g., argon) into a plasma (e.g., plasma 130). The plasma can then spread radially outward in the process region 246 in the direction of arrow L. The diverging interior surface 234 of the upper shield 220 can encourage radially outward movement of the plasma. Most of the plasma is contained in a region above the substrate (e.g., substrate 126 in FIG. 1) by the electromagnetic energy. Contaminants on the substrate and/or substrate material removed by ions from the plasma moves further radially outward in the direction of arrow L and are then deflected in a downward direction, as indicated by arrow M, by the inwardly curved surfaces of the outward portion of the interior surface 236 and the cylindrical liner 230 of the upper shield 220. The contaminants and/or substrate material are directed toward the lower shield 250, 270. The relatively large radius of curvature of the outward portion of the interior surface 236 can promote movement of the contaminants and/or substrate material compared to a sharp corner or a smaller radius of curvature. Put differently, a sharp corner or a corner with a small radius of curvature may cause the contaminants and/or substrate material flowing in the direction of arrow M to momentarily stagnate at the corner. Such stagnation can allow the contaminants and/or substrate material to accumulate on the interior surfaces 234, 236, and 240 of the upper shield.

Figure 5A:
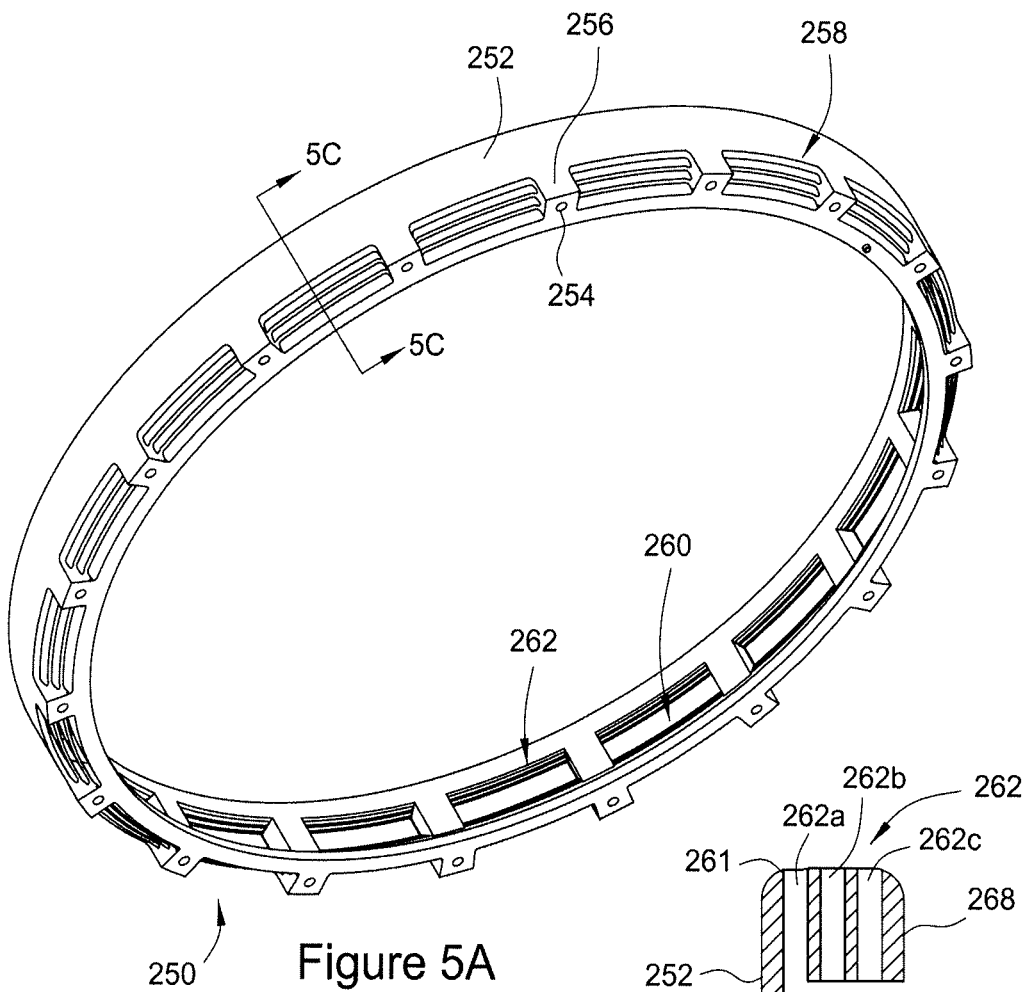
FIG. 5A is a bottom perspective view of a first portion of the lower shield shown in FIG. 2A.
Figure 5C:
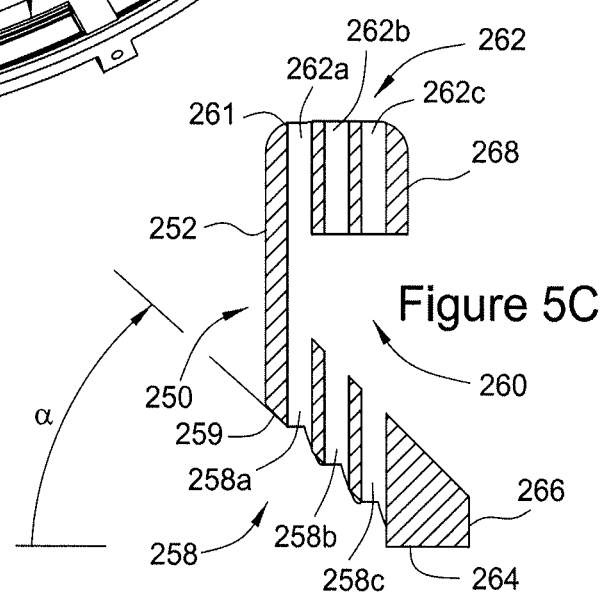
FIG. 5C is a cross-sectional side view of the first portion of the lower shield shown in FIG. 2A.
Figure 5B:
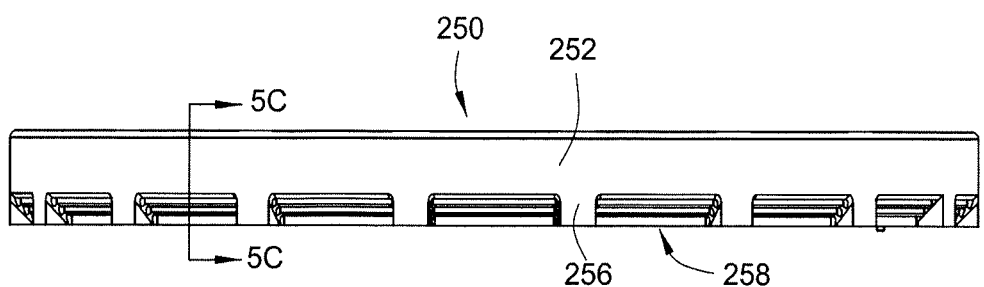
FIG. 5B is a side view of the first portion of the lower shield shown in FIG. 2A.
Figure 6A:
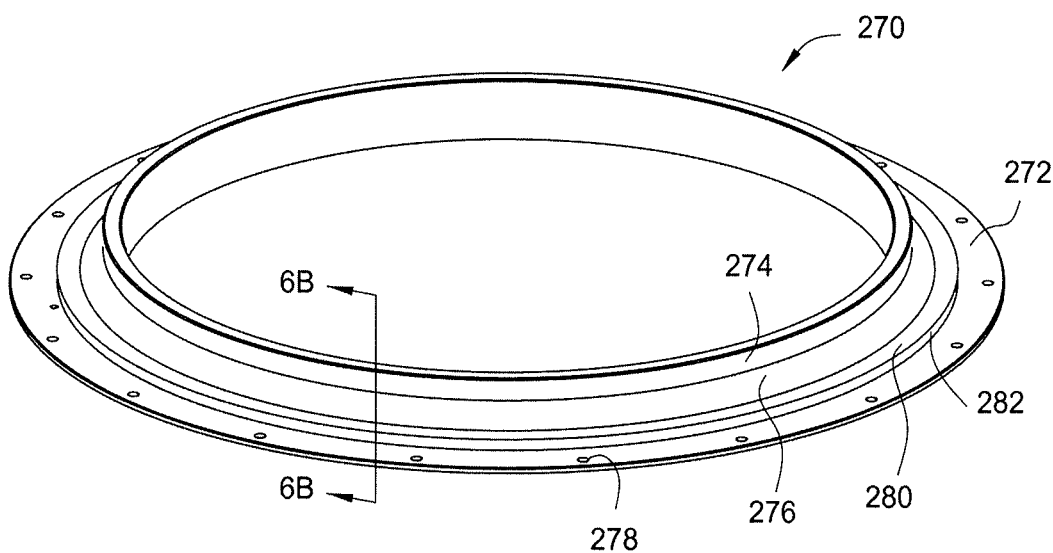
FIG. 6A is a top perspective view of a second portion of the lower shield shown in FIG. 2A.
Figure 6B:
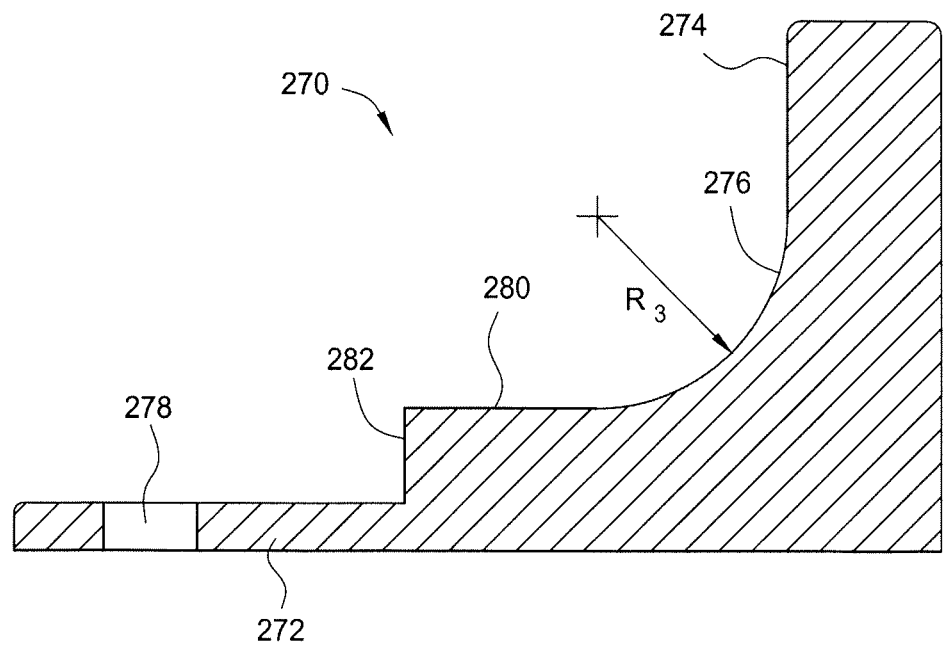
FIG. 6B is a cross-sectional side view of the second portion of the lower shield shown in FIG. 2A.

In the exemplary lower shield 250, 270 shown in the figures, the lower shield includes a first portion 250 in the second portion 270. FIGS. 5A and 5B illustrate a first portion 250 of the lower shield and FIGS. 6A and 6B illustrate a second portion 270 of the lower shield. The first portion 250 includes a ring-shaped body 252 that includes a plurality of fastener holes 254 arranged around a circumference. A radially-inward facing side of the ring-shaped body 252 includes a plurality of outward-facing undercuts 260 that are arranged between the fastener holes 254. A plurality of upward facing slots 262 can extend from each outward-facing undercut 260 to a top surface 261 of the ring-shaped body 252. A plurality of downward-facing slots 258 can extend from each outward-facing undercut 260 toward a bottom surface 259 of the ring-shaped body 252. For example, the upward facing slots 262 can include three slots 262a, 262b, and 262c and downward-facing slots 258 can include three slots 258a, 258b, and 258c. A set of the three slots 262a, 262b, and 262c can be arranged at the same circumferential location on the ring-shaped body 252, but at different radial locations. In the exemplary ring-shaped body 252 shown in FIGS. 5A-5C, slot 262a is the most radially outboard slot, slot 262b is the middle slot, and slot 262c is the most radially inboard slot. Similarly, a set of the three slots 258a, 258b, and 258c can be arranged at the same circumferential location on the ring-shaped body 252, but at different radial locations. In the exemplary ring-shaped body 252 shown in FIGS. 5A-5C, slot 258a is the most radially outboard slot, slot 258b is the middle slot, and slot 258c is the most radially inboard slot. In certain instances, the slots 258, 262 can define aspect ratios (defined as a length of the slot from the outward-facing undercut 260 to an exterior surface of the ring-shaped body 252 divided by a width of the slot in a radial direction) of 4.5 to 1. For example, the length of each slot may be 0.45 inches and the width of each slot may be 0.10 inches, resulting in an aspect ratio of 4.5 to 1. In various other instances, the aspect ratio for the slots may be between 3 to 1 and 6 to 1, for example. In various instances, the bottom surface 259 of the ring-shaped body 252 can be arranged at an angle α relative to a horizontal bottom surface 264 such that the bottom surface 259 increases in height at larger radial distances. Such an angle α can provide clearance for the slots 258 from the second portion 270 of the lower shield and from other structures, such as the bracket 312 shown in FIG. 2B. The outward-facing undercut 260 can include a similarly-angled surface so that the aspect ratios for the slots 258 are maintained.

FIGS. 6A and 6B illustrate the second portion 270 of the lower shield. The second portion 270 includes a vertical liner portion 274 and a horizontal liner portion 280 with a curved liner portion 276 there between. The curved liner portion 276 defines a radius of curvature $R_3$. In certain instances, the radius of curvature $R_3$ may be 0.40 inches. In various other instances, the radius of curvature $R_3$ may be between 0.2 inches and 0.6 inches. The second portion 270 also includes a fastener flange 272 that includes a plurality of threaded holes 278 arranged there around. A transition from the horizontal liner portion 280 to the fastener flange 272 includes a vertical lip 282. Fasteners, such as cap screws, can pass through the fastener holes 254 in the ring-shaped body 252 of the first portion 250 and engage the threaded holes 278 in the fastener flange 272 to fasten the first portion 250 and the second portion 270 together.

Figure 7:
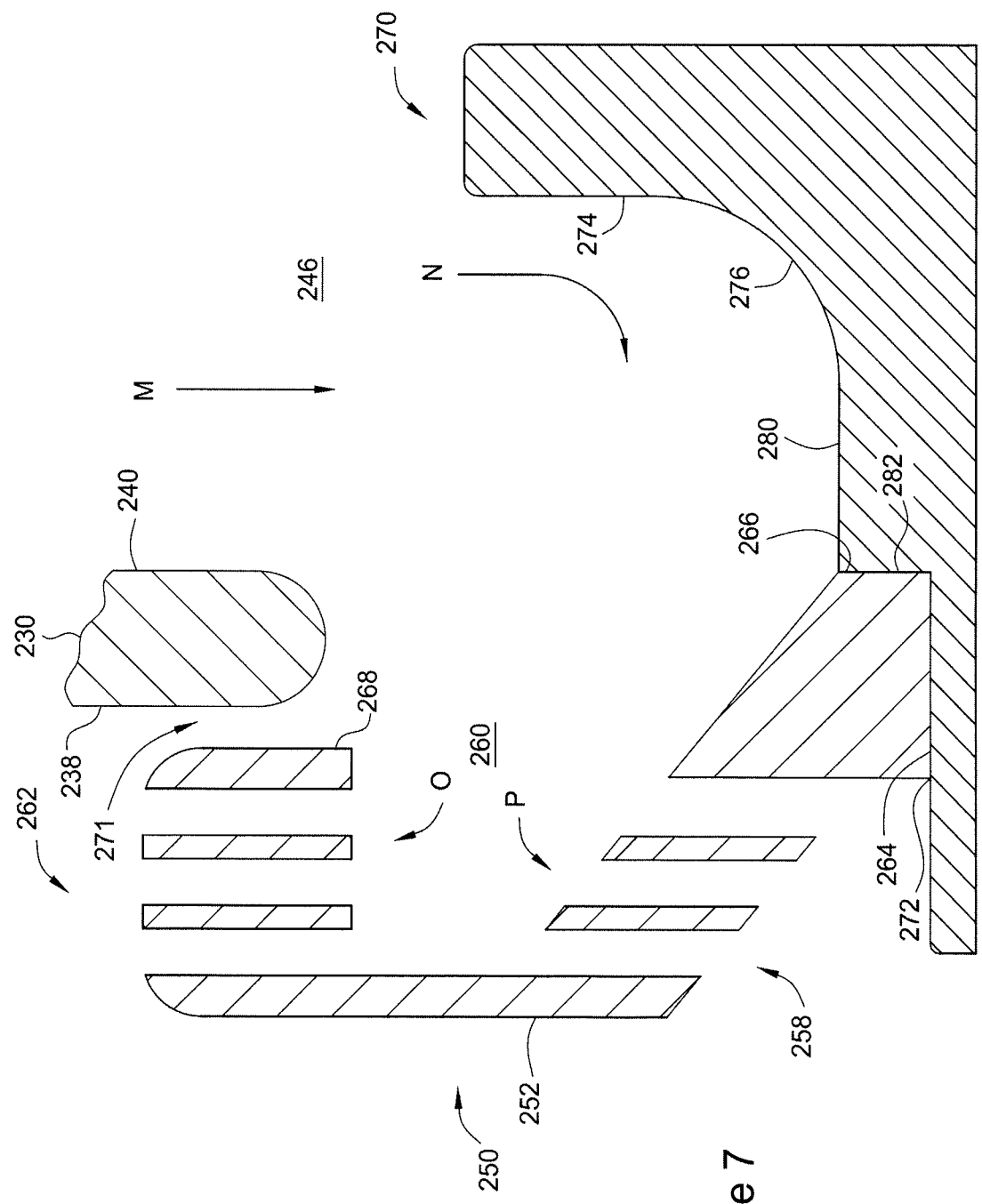
FIG. 7 is a cross-sectional side view of a portion of the lower shield and a portion of the upper shield of FIG. 2A.

FIG. 7 illustrates the first portion 250 and second portion 270 of the lower shield assembled together. FIG. 7 also illustrates a bottom portion of the cylindrical liner 230 of the upper shield 220 engaged with the first portion 250 of the lower shield (e.g., engaged in the plasma processing chamber 300 shown in FIG. 2B). As shown in FIG. 7, the cylindrical liner 230 of the upper shield 220 can be separated from the first portion 250 of the lower shield such that an annular gap 271 is formed between an outward-facing surface 238 of the cylindrical liner 230 and an inward-facing upper surface 268 of the first portion 250. The annular gap 271 can have a similar aspect ratio to the slots 262. Such an annular gap could function as a slot in addition to the slots 262 in the first portion 250 of the lower shield 250, 270. Alternatively, the outward-facing surface 238 of the cylindrical liner 230 could lightly contact or be closely-spaced from the inward-facing upper surface 268 of the first portion 250 of the lower shield. When the first portion 250 of the lower shield is assembled with the second portion 270, a bottom surface 264 of the first portion 250 rests on the fastener flange 272. Also, a lower inward-facing surface 266 of the first portion 250 is adjacent to the vertical lip 282 of the second portion 270. In various instances, the inward-facing surface 266 contacts the vertical lip 282. In various other instances, the inward-facing surface 266 may be separated from the vertical lip 282 by an annular gap. The first portion 250 and the second portion 270 create a flow path for contaminants and/or substrate materials to escape from the process region 246. FIG. 7 illustrates arrow M which is the flow of contaminants and/or substrate materials from the process region 246 after the materials have been redirected downwardly by the outward portion of the interior surface 236 and the cylindrical liner 230 of the upper shield 220. The materials are turned radially outward, as indicated by arrow N, by the vertical liner portion 274, the curved liner portion 276, and the horizontal liner portion 280 of the second portion 270 of the lower shield. The materials enter the outward-facing undercuts 260 in the first portion 250 of the lower shield. The materials then flow in the direction of arrow O through the upward-facing slots 262 and in the direction of arrow P to the downward-facing slots 258.

FIG. 2B, illustrates the process kit 200 arranged in a plasma processing chamber 300 and the flow of process gas through the plasma processing chamber 300. The plasma processing chamber 300 includes a lid 302 and chamber walls 304. The diffuser 202 of the process kit 200 is installed in and attached to the upper shield 220. The lower shield 250, 270 is mounted to a pedestal 310 by a bracket 312. The pedestal 310 can move up and down (in the directions of arrow Z). The pedestal 310 may be moved downwardly (away from the upper shield 220) to position the substrate supported on the pedestal 310 below the upper shield 220 to allow the substrate to be robotically transferred from the pedestal 310. The pedestal 310 can be moved upwardly (toward the upper shield 220) to engage the cylindrical wall 230 of the upper shield 220 with the first portion 250 of the lower shield (as discussed above with reference to FIG. 7) and, as a result, form the process region 246.

An edge ring 314 can surround and partially rest on a top surface of the pedestal. The edge ring 314 can ensure that plasma in the process region 246 extends across the entire substrate. The diffuser 202, upper shield 220, and lower shield 250, 270 are grounded from the pedestal 310 and radiofrequency source. The edge ring 314 may be made of quartz or another electrically insulating material. In various aspects, the bracket 312 that attaches the lower shield 250, 270 to the pedestal may also be made of an electrically insulating material, such as a plastic material. In various other aspects, the bracket 312 can be made of metal and an insulative material can be arranged between the bracket 312 and the pedestal 312. A plurality of grounding rings 318 can be attached to a bracket 316 in the plasma processing chamber 300. For example, referring again to FIG. 5A, the grounding rings 318 can be spaced apart circumferentially such that each grounding ring 318 is aligned with one of the fastener holes 254 in the first portion 250 of the lower shield. When the pedestal 310 is raised toward the upper shield 220, the grounding rings 318 contact in the top surface 261 of the first portion 250 of the lower shield 250, 270, thereby electrically coupling the lower shield 250, 270 to the grounded upper shield 220 and lid 302 of the plasma processing chamber 300. The grounding rings 318 are generally hoop shaped and are elastically deformable in the direction of arrows Z. As a result, the grounding rings 318 can maintain contact with the fasteners in the first portion 250 of the lower shield over a range of positions of the pedestal 310 and the lower shield 250, 270 relative to the upper shield 220.

FIG. 2B illustrates the flow of process gas (e.g., argon) into the plasma processing chamber 300, through the process region 246, and out of the plasma processing chamber 300. The process gas enters the plasma processing chamber 300 through a port 308 in the lid 302 (as indicated by arrow G). The port 308 is in communication with the diffuser 202 such that the process gas passes through the diffuser 202 in the center of the upper shield 220 and into the process region 246 (as indicated by arrows J). In the process region 246, the process gas is ignited into a plasma by electromagnetic energy. The plasma etches contaminants and/or substrate materials from a substrate on the pedestal 310. The etched contaminants and/or substrate materials (and any plasma that may escape from the electromagnetic field) flow radially outward in the direction of arrows L. The etched materials are then deflected downward by the upper shield 220 toward the lower shield 250, 270 in the direction of arrow M. The second portion of the lower shield 270 directs the etched materials radially outward in the direction of arrow N. The etched materials then pass through the slots 262 and 258 in the first portion 250 of the lower shield 250, 270 in the directions of arrows O and P, respectively. The etched materials can then pass through the port 306 in the direction of arrow Q to leave the plasma processing chamber 300.

Testing of plasma processing chambers using the process kit 200 shown in FIG. 2A demonstrate an improvement in plasma processing efficiency. For example, a plasma processing chamber using a process kit like the process kit 200 shown in FIG. 2A has shown approximately a four-fold increase in flow of process gas and removed contaminant and/or substrate materials for a given operating pressure (e.g., 0.007 Torr). Additionally, the curved surface 236 on the upper shield 220 and curved surface 276 on the lower shield 250, 270 show significant reductions in the accumulation of contaminants and/or substrate materials on the upper shield 220 and lower shield 250, 270, which should result in fewer required maintenance steps for the process kit 200.

What is claimed is:

1. A process kit for a plasma processing chamber, the process kit comprising:
    a shield comprising:
        an annular ring;
        an annular channel in a top surface of the annular ring, wherein a radially-outward-facing liner and a bottom liner include a circularly-curved liner portion there between, and wherein the annular channel includes a radially-outward-projecting undercut portion;
        a first plurality of slots between the undercut portion and the top surface of the annular ring, the first plurality of slots arranged around a circumference of the annular ring, the first plurality of slots perpendicular to a radial plane of the annular ring and partially defined by a first surface and a second surface substantially parallel to the radial plane; and
        a second plurality of slots between the undercut portion and a bottom surface of the annular ring, the second plurality of slots are arranged around a circumference of the annular ring, the second plurality of slots perpendicular to the radial plane and partially defined by a third surface and a fourth surface disposed at an obtuse angle relative to the radial plane.

2. The process kit of claim 1, wherein the circularly-curved liner portion of the annular channel defines a radius of curvature of between 0.2 inches and 0.6 inches.

3. The process kit of claim 1, wherein the first plurality of slots defines an aspect ratio between 3 to 1 and 6 to 1.

4. The process kit of claim 1, wherein the second plurality of slots defines an aspect ratio between 3 to 1 and 6 to 1.

5. The process kit of claim 1, wherein the first plurality of slots comprises include a first slot at a circumferential location of the annular ring and a second slot at the circumferential location, and wherein the first slot and the second slot are located at different radial locations.

6. The process kit of claim 5, wherein the first plurality of slots further comprises a third slot at the circumferential location of the annular ring, and wherein the third slot is located at a different radial location from the first slot and the second slot.

7. The process kit of claim 1, wherein the second plurality of slots comprises include a first slot at a circumferential location of the annular ring and a second slot at the circumferential location, and wherein the first slot and the second slot are located at different radial locations.

8. The process kit of claim 7, wherein the second plurality of slots further comprises a third slot at the circumferential location of the annular ring, and wherein the third slot is located at a different radial location from the first slot and the second slot.

* * * * *